United States Patent
Chen et al.

(10) Patent No.: US 8,927,992 B2
(45) Date of Patent: Jan. 6, 2015

(54) DISPLAY APPARATUS

(71) Applicants: AU Optronics (Suzhou) Corp., Ltd., Suzhou (CN); AU Optronics Corporation, Hsin-Chu (TW)

(72) Inventors: Xiang-Chong Chen, Suzhou (CN); Tung-Shin Lin, Hsin-Chu (TW); Yun-Tao Guo, Suzhou (CN); Cheng-Min Tsai, Hsin-Chu (TW); Shih-Ping Lin, Hsin-Chu (TW)

(73) Assignees: AU Optronics (Suzhou) Corp., Ltd., Suzhou (CN); AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/781,962

(22) Filed: Mar. 1, 2013

(65) Prior Publication Data

US 2013/0256671 A1  Oct. 3, 2013

(30) Foreign Application Priority Data

Apr. 1, 2012  (CN) .......................... 2012 1 0099634

(51) Int. Cl.
*H01L 27/15* (2006.01)
*G02F 1/1333* (2006.01)
*F21V 8/00* (2006.01)

(52) U.S. Cl.
CPC ........ *H01L 27/153* (2013.01); *G02F 1/133308* (2013.01); *G02B 6/0091* (2013.01); *G02F 2001/133314* (2013.01); *G02F 2001/133317* (2013.01); *G02F 2202/28* (2013.01); *G02B 6/0083* (2013.01)
USPC .............................................. 257/59; 349/58

(58) Field of Classification Search
CPC ............ H01L 27/153; G02F 1/133608; G02F 2001/13332; G02F 1/133308; G02F 1/13452; G02F 2001/133317; G02F 2001/133328; G02F 2201/46; G02F 1/13394; G02F 1/1347; G02F 1/13454; G02F 2002/28; G09G 2300/0426; G02B 6/0083
USPC ......... 257/59, 72; 349/58, 60; 362/97.1, 97.2, 362/559–561, 632–634
See application file for complete search history.

(56) References Cited

U.S. PATENT DOCUMENTS

| | | | |
|---|---|---|---|
| 2001/0010569 A1* | 8/2001 | Jin et al. ........................... | 349/58 |
| 2008/0088765 A1* | 4/2008 | Hashimoto ..................... | 349/58 |
| 2012/0013818 A1* | 1/2012 | Park et al. ....................... | 349/58 |

FOREIGN PATENT DOCUMENTS

TW        I276893        3/2007

* cited by examiner

*Primary Examiner* — Marcos D. Pizarro
*Assistant Examiner* — Sue Tang
(74) *Attorney, Agent, or Firm* — WPAT, PC; Justin King (57) ABSTRACT

A display apparatus includes a backlight module, a panel module, and a plurality of double-sided adhesive tapes. The backlight module includes a bezel. The frame has a supporting surface. The panel module includes a glass substrate and a plurality of chips. The glass substrate is disposed on the supporting surface. An edge of the glass substrate has a bonding region. The chips are disposed at the bonding region. The chips and the supporting surface are respectively located at two opposite sides of the glass substrate. The double-sided adhesive tapes are disposed between the supporting surface and the bonding region. Each of the double-sided adhesive tapes is located at a gap between two adjacent chips.

8 Claims, 10 Drawing Sheets

DISPLAY APPARATUS

RELATED APPLICATIONS

This application claims priority to China Application Serial Number 201210099634.8, filed Apr. 1, 2012, which is herein incorporated by reference.

BACKGROUND

1. Technical Field

The present disclosure relates to a display apparatus.

2. Description of Related Art

In recent years, owing to the rapid development of the electronics industry and the information industry, their related products also become increasingly sophisticated. For the current personal computers, in addition to seeking more rapid and more powerful computing units and a wide range of peripheral equipments to meet user needs, compact portable computers are the key development area of the industry.

For example, liquid crystal displays have advantages such as high definition, small size, light weight, low driving voltage, low power consumption, and a wide range of applications, and thus can be widely applied in portable televisions, mobile phones, camcorders, notebook computers, desktop monitors, and other consumer electronics products and become the mainstream of the displays.

With the trend of decreasing in the thickness of display apparatuses, the primary components in the display apparatuses (such as panel modules, backlight modules, etc.) have to be thinner. In order to satisfy the requirement, it is considered to directly thin the components in the liquid crystal displays during manufacturing. For example, current IPS (In Plane Switching) liquid crystal displays using an AHVA (Advanced Hyper-Viewing Angle) display technology gradually adopt a thin glass substrate of which the thickness is less than 0.5 mm.

In a COG (Chip-On-Glass) process of a display apparatus, in order to mount a frame of a backlight module with a glass substrate of a panel module, a non-segmented double-sided adhesive tape is usually stuck between the frame and the glass substrate. The position of the non-segmented double-sided adhesive tape stuck to the glass substrate and the positions of chips disposed on the glass substrate are respectively located at two opposite sides of the glass substrate and aligned with each other.

However, the glass substrate with a smaller thickness has weak structural strength, and thus the glass substrate is easily affected by local stress due to its weight or the adhesion force of the double-sided adhesive tape in the COG process. The glass substrate and the chips respectively have different coefficients of expansion, which result in the flexure of the glass substrate and cause light leakages at locations respectively corresponding to an upper-left corner and an upper-right corner of each of the chips. Thus, COG mura appears on the screen of the display apparatus. Furthermore, when the display apparatus encounters an unexpected impact, the edge of the glass substrate may have cracks or notches, or the entire glass substrate may be broken. Although a thin film made of resin or plastic is considered to substitute the glass substrate, the film-forming temperature is limited, and thus is not practically feasible.

Accordingly, many in the industry are endeavoring to develop an assembly technique for reducing the flexure of the glass substrate.

SUMMARY

In order to solve the problems of the prior art, the disclosure provides an improved display apparatus, in which segmented double-sided adhesive tapes are stuck on a supporting surface of a frame of a backlight module. Furthermore, when a TFT (Thin-Film Transistor) array substrate of a panel module of the display apparatus is mounted to the frame, each of the double-sided adhesive tapes located at a gap between two adjacent chips on the TFT array substrate, so as to effectively eliminate the light leakages occur at locations respectively corresponding to an upper-left corner and an upper-right corner of each of the chips and to prevent a screen of the display apparatus from showing COG mura as much as possible.

According to an embodiment of the disclosure, a display apparatus includes a backlight module, a panel module, and a plurality of double-sided adhesive tapes. The backlight module includes a frame. The frame has a supporting surface. The panel module includes a glass substrate and a plurality of chips. The glass substrate is disposed on the supporting surface. An edge of the glass substrate has a bonding region. The chips are disposed at the bonding region. The chips and the supporting surface are respectively located at two opposite sides of the glass substrate. The double-sided adhesive tapes are disposed between the supporting surface and the bonding region. Each of the double-sided adhesive tapes is located at a gap between two adjacent chips.

In an embodiment of the disclosure, a vertical projection of each of the double-sided adhesive tapes is not overlapped with vertical projections of two adjacent chips on the supporting surface.

In an embodiment of the disclosure, the chips are arranged along an arrangement direction. A length of each of the double-sided adhesive tapes along the arrangement direction is ¼ to 1 times of a width of a corresponding gap along the arrangement direction.

In an embodiment of the disclosure, a length of each of the double-sided adhesive tapes along the arrangement direction is ½ to ¾ times of the width of the corresponding gap along the arrangement direction.

In an embodiment of the disclosure, a vertical projection of each of the double-sided adhesive tapes is partially overlapped with vertical projections of two adjacent chips on the supporting surface.

In an embodiment of the disclosure, the chips are arranged along an arrangement direction. Each of the double-sided adhesive tape has two overlapped portions respectively corresponding to two adjacent chips. A length of each of overlapping portions along the arrangement direction is ⅓ to ⅙ times of a length of the corresponding chip along the arrangement direction.

In an embodiment of the disclosure, a length of each of overlapped portions along the arrangement direction is ⅙ times of a length of the corresponding chip along the arrangement direction.

In an embodiment of the disclosure, the glass substrate is a TFT array substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

An improved display apparatus is provided. Specifically, segmented double-sided adhesive tapes are stuck on a supporting surface of a frame of a backlight module. Furthermore, when a TFT (thin-film transistor) array substrate of a panel module of the display apparatus is mounted to the frame, each of double-sided adhesive tapes is located at a gap between two adjacent chips on the TFT array substrate, so as to effectively eliminate the light leakages occurring at locations respectively corresponding to an upper-left corner and an upper-right corner of each of the chips and prevent a screen of the display apparatus from showing COG mura as much as possible. The foregoing COG mura is related to a length of a segmented double-sided adhesive tape. A JND value can be obtained by determining and quantifying the scale of the COG mura. The JND value is less than 1.8 when the COG mura is not detected, and the JND value gradually increases with the increasing COG mura. By appropriately reducing the length of the double-sided adhesive tape, the disclosure can effectively reduce the JND value, and increment values of JND values detected at different processes of the panel module are also reduced.

Figure 1:
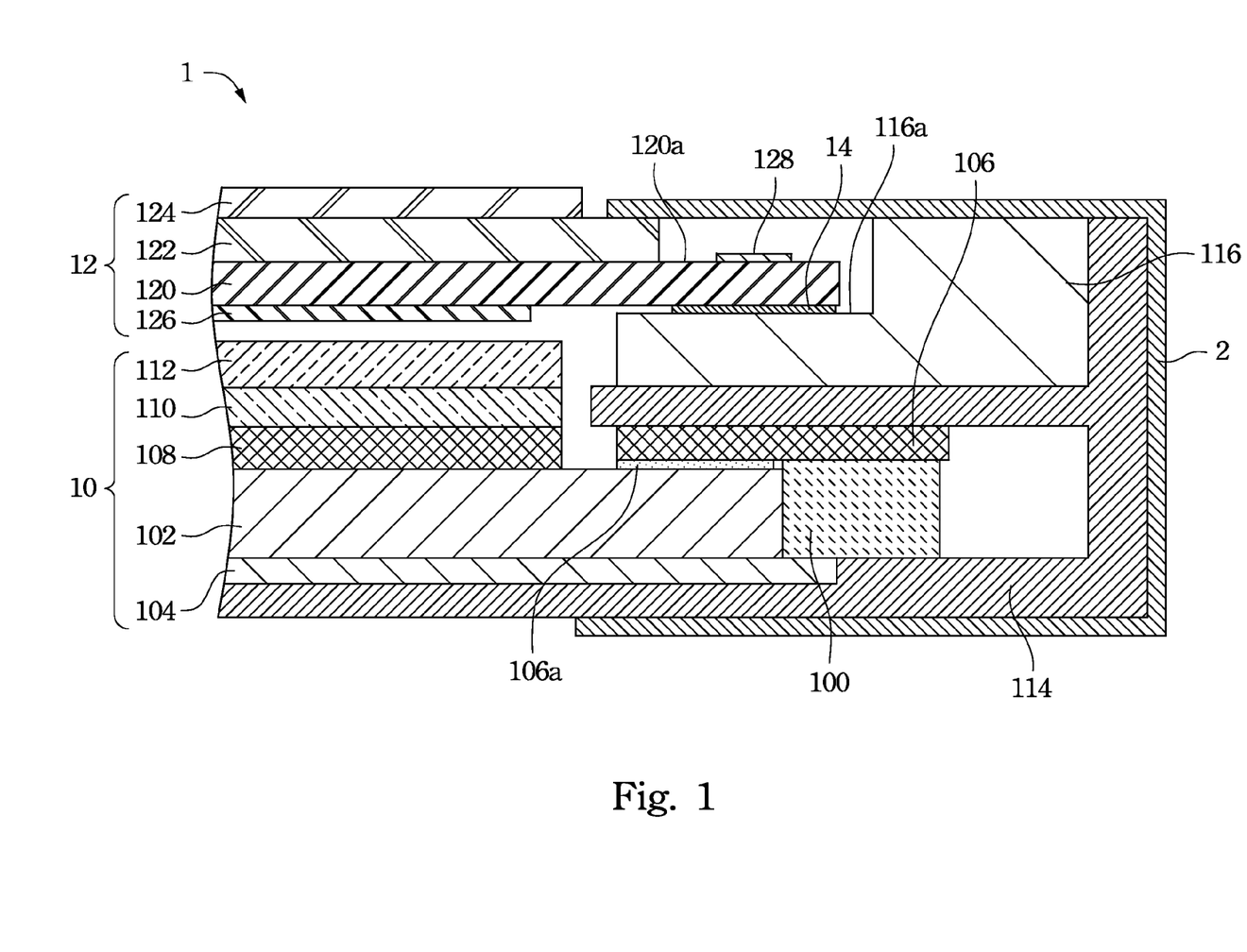
FIG. 1 is a partially cross-sectional view of a display apparatus according to an embodiment of the disclosure.

FIG. 1 is a partially cross-sectional view of a display apparatus 1 according to an embodiment of the disclosure.

An electronic apparatus using the display apparatus 1 of the disclosure can be a portable computer device (e.g., a notebook computer, a tablet computer, etc.) or a portable electronic product (e.g., a PDA, a mobile phone, a game console, etc.), but the disclosure is not limited thereto. That is, the electronic apparatus using the display apparatus 1 of the disclosure can be any electronic product that has a display function. As long as there are requirements of reducing the warpage of the glass substrate and easing the COG mura, the concepts of the disclosure can be applied to the design of the display apparatus 1. Embodiments of the disclosure are introduced in detail below.

As shown in FIG. 1, the display apparatus 1 of the disclosure includes a backlight module 10 and a panel module 12. The backlight module 10 of the display apparatus 1 includes light sources 100, a light guide plate 102, a reflector 104, a circuit board 106, a diffusing film 108, a prism layer 110, optical films 112, a bezel 114, and a frame 116. The frame 116 of the backlight module 10 is assembled to an inner wall of the bezel 114 with a periphery thereof. An edge of the frame 116 of the backlight module 10 is supported on the bezel 114, and the frame 116 surrounds the panel module 12. The reflector 104 of the backlight module 10 is disposed on the bezel 114, and the light guide plate 102 is disposed on the reflector 104. The light sources 100 of the backlight module 10 are disposed on the bezel 114 adjacent to a side of the light guide plate 102.

In the embodiment, the light sources 100 of the backlight module 10 are LEDs (Light-Emitting Diodes), but the disclosure is not limited thereto. In another embodiment, the light sources 100 of the backlight module 10 can be cold cathode fluorescent lamps (CCFLs). The circuit board 106 of the backlight module 10 is electrically connected to the light sources 100 and is adhered to the light guide plate 102 by an adhesive 106a. In an embodiment, the circuit board 106 of the backlight module 10 is a flexible circuit board, but the disclosure is not limited thereto. The diffusing film 108, the prism layer 110, and the optical films 112 are sequentially disposed on the light guide plate 102, but the disclosure is not limited thereto and other optical films can be additionally added or removed.

The frame 116 supports the edge of the panel module 12 of the display apparatus 1. The panel module 12 of the display apparatus 1 includes a TFT substrate 120, a color filter array substrate 122, an upper polarizer 124, and a lower polarizer 126. The TFT array substrate 120 and the color filter array substrate 122 of the panel module 12 can be made of glass substrates. The TFT array substrate 120 and the color filter array substrate 122 of the panel module 12 are adhered to each other. The upper polarizer 124 of the panel module 12 is adhered on the color filter array substrate 122. The lower polarizer 126 of the panel module 12 is adhered on the TFT array substrate 120.

With this configuration, the light sources 100 of the backlight module 10 may emit light into the light guide plate 102, and the light is reflected by the reflector 104 to sequentially pass through the diffusing film 108, the prism layer 110, the optical films 112, the lower polarizer 126, the TFT array substrate 120, the color filter array substrate 122, and the upper polarizer 124, and then leave the panel module 12, such that the light can be seen by users.

As shown in FIG. 1, the frame 116 of the backlight module 10 has a supporting surface 116a. The TFT array substrate 120 of the panel module 12 is disposed on the supporting surface 116a of the frame 116. An edge of the TFT array substrate 120 has a bonding region 120a. In the embodiment, the bonding region 120a is a portion of the TFT array substrate 120 that laterally protrudes relative to an edge of the color filter array substrate 122 toward an edge of the display apparatus 1. The panel module 12 further includes a plurality of chips 128 (FIG. 1 only illustrates one of the chips 128). The chips 128 of the panel module 12 are disposed at the bonding region 120a of the TFT array substrate 120. The chips 128 of the panel module 12 and the supporting surface 116a of the frame 116 are respectively located at two opposite sides of the TFT array substrate 120. The display apparatus 1 further includes double-sided adhesive tapes 14. The double-sided adhesive tapes 14 of the display apparatus 1 are disposed between the supporting surface 116a of the frame 116 and the bonding region 120a of the TFT array substrate 120, so that the frame 116 and the TFT array substrate 120 can be adhered to each other.

Figure 2A:
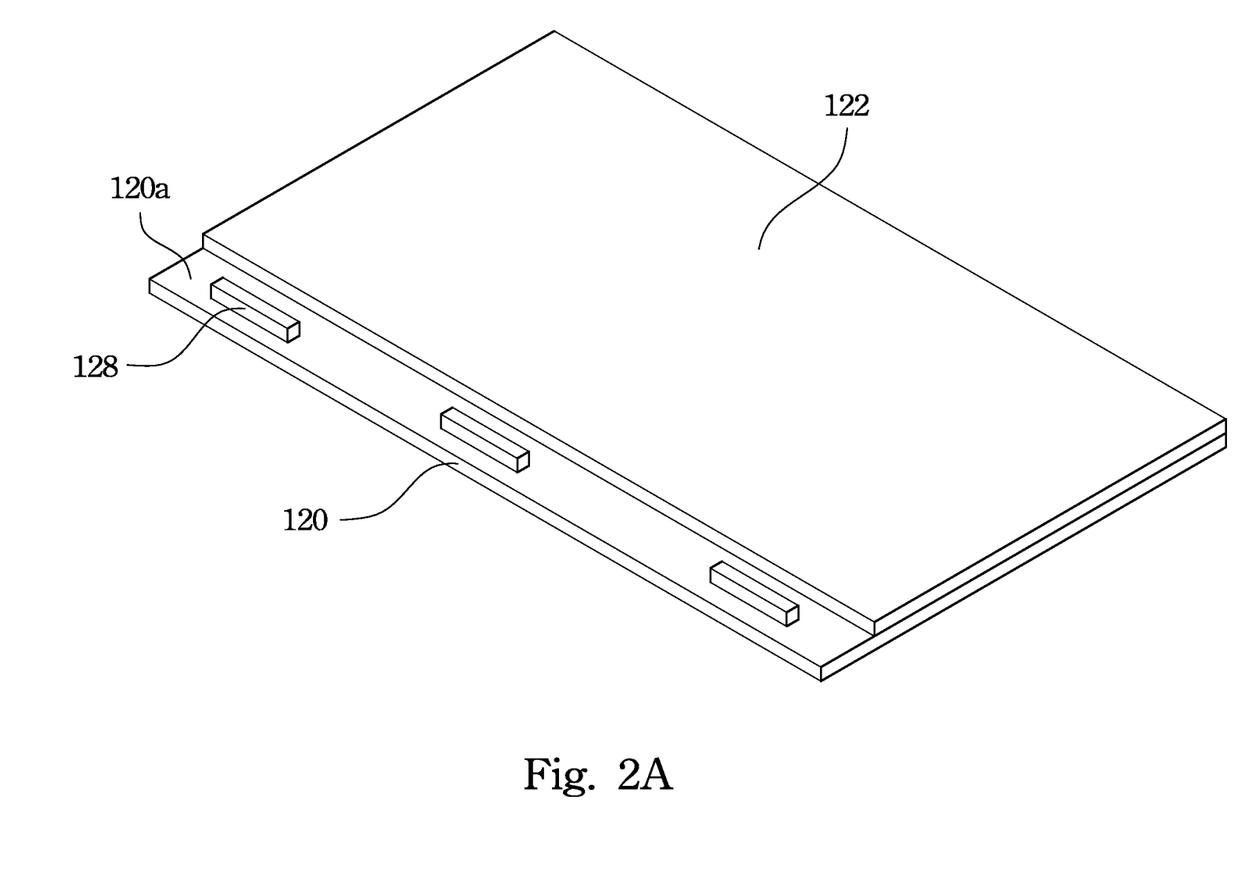
FIG. 2A is a partially perspective view of a TFT (thin-film transistor) array substrate and a color filter array substrate.
Figure 2B:
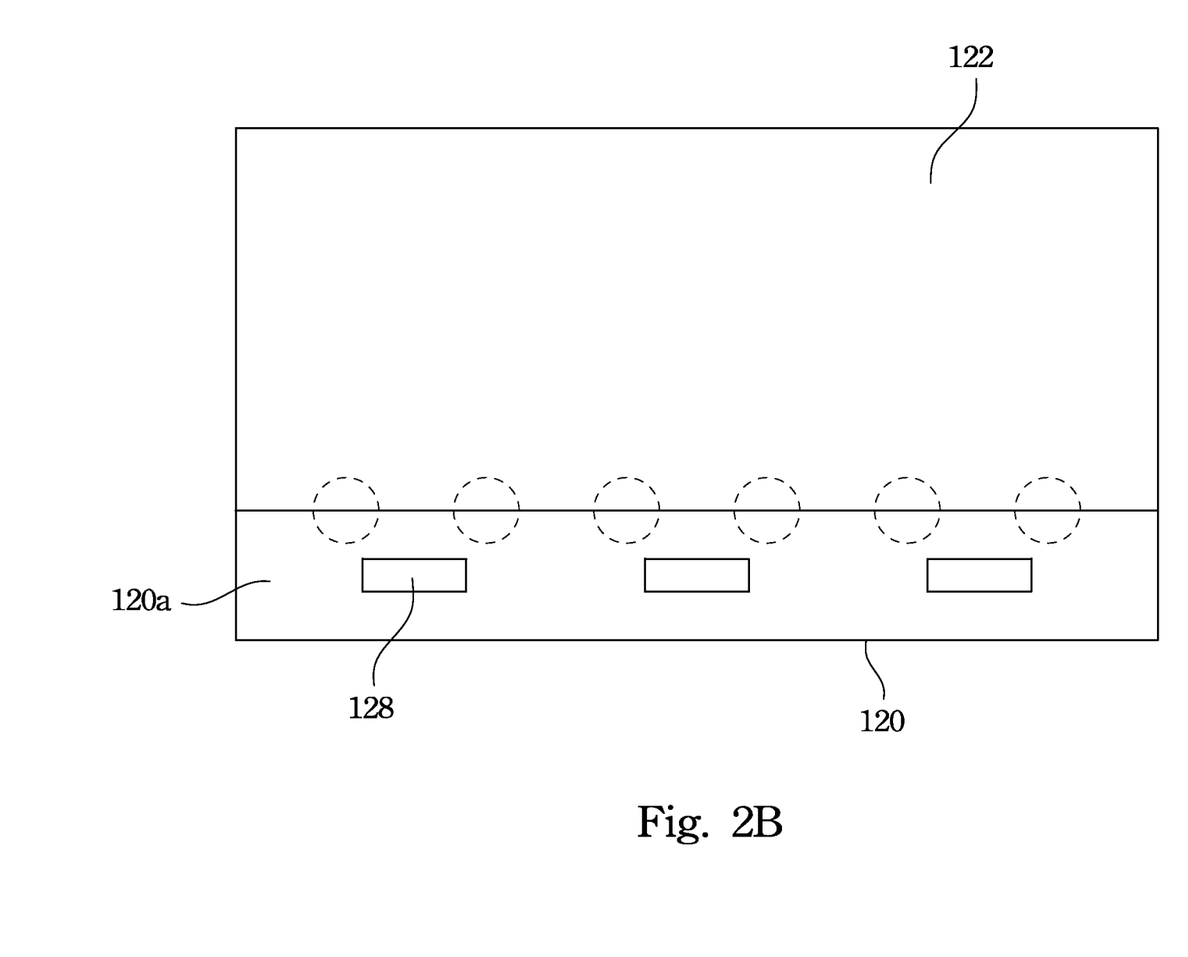
FIG. 2B is a top view of the TFT array substrate and the color filter array substrate in FIG. 2A.

FIG. 2A is a partially perspective view of the TFT array substrate 120 and the color filter array substrate 122. FIG. 2B is a top view of the TFT array substrate 120 and the color filter array substrate 122 in FIG. 2A.

As shown in FIG. 2A and FIG. 2B, after a JI (JIZOKU) process (i.e., the chips 128 are disposed at the bonding region 120a of the TFT array substrate 120) is performed on the panel module 12. The TFT array substrate 120 and the chips 128 respectively have different coefficients of expansion, and are influenced by local stresses, thus resulting in flexure of the bonding region 120a of the TFT array substrate 120 and causing light leakages at locations of the bonding region 120a respectively corresponding to the upper-left corner and the upper-right corner (as indicated by dotted circles in FIG. 2B) of each of the chips 128. Therefore, COG mura appears on the screen of the conventional display apparatus. Furthermore, after the TFT array substrate 120 of the panel module 12 is disposed on the supporting surface 116a of the frame 116 and the bonding region 120a is adhered to the double-sided adhesive tapes on the supporting surface 116a, the light leakages at the locations of the bonding region 120a respectively corresponding to the upper-left corner and the upper-right corner of each of the chips 128 are getting worse, and so does the COG mura on the screen of the conventional display apparatus.

Figure 3:
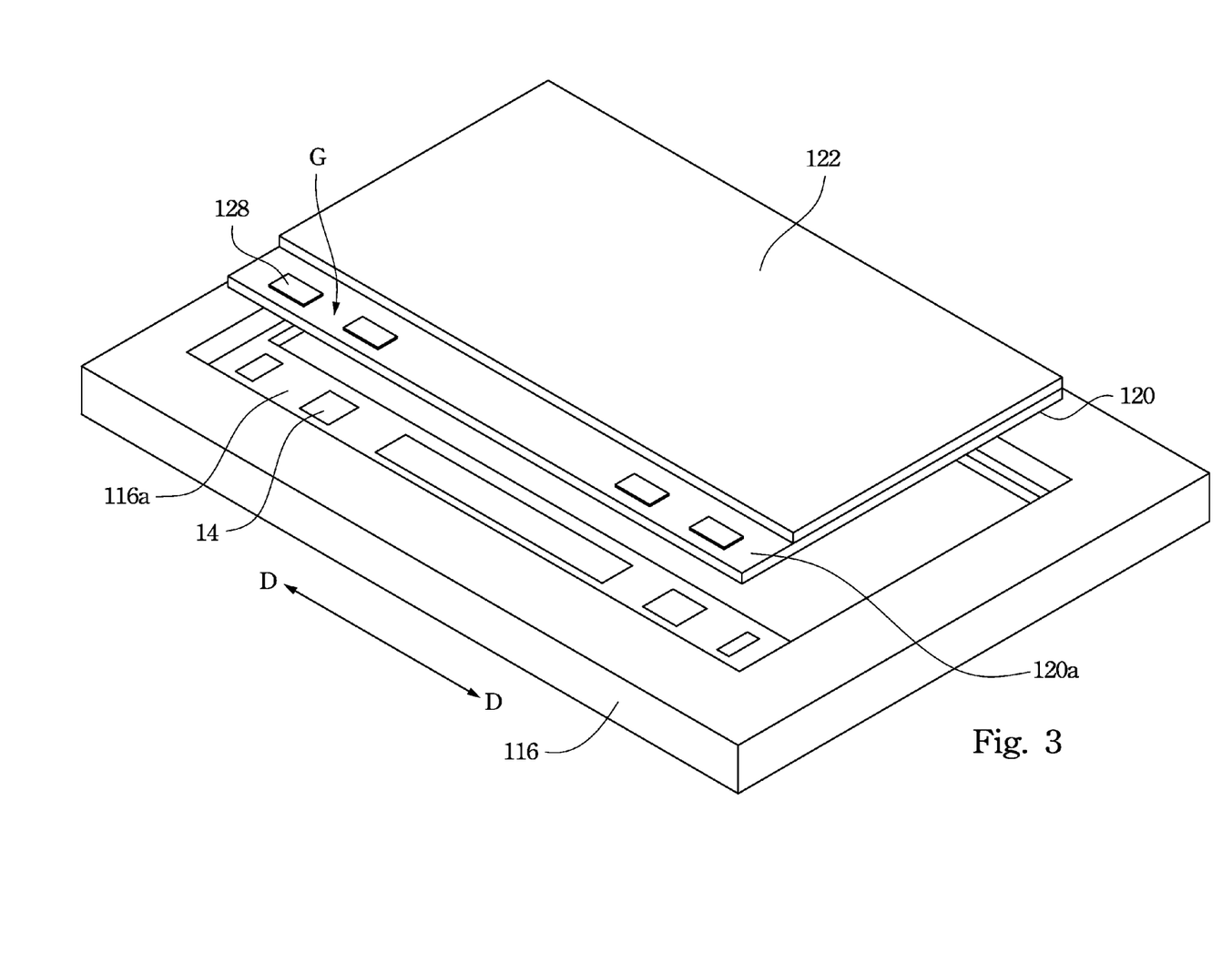
FIG. 3 is an exploded view of a frame, the TFT array substrate, and the color filter array substrate in FIG. 1.

FIG. 3 is an exploded view of a frame 116, the TFT array substrate 120, and the color filter array substrate 122 in FIG. 1.

As shown in FIG. 3, in order to eliminate the aforementioned light leakages, a plurality of double-sided adhesive tapes 14 between the supporting surface 116a of the frame 116 and the bonding region 120a of the TFT array substrate 120 are disposed in the display apparatus 1. Each of the double-sided adhesive tapes 14 is located at a gap G between two adjacent chips 128 across the TFT array substrate 120. In other words, the display apparatus 1 of the disclosure adopts the approach of disposing the segmented double-sided adhesive tapes 14 on the supporting surface 116a of the frame 116 of the backlight module 10 and aligning each of the double-sided adhesive tapes 14 with the gap G between two adjacent chips 128 across the TFT array substrate 120. That is, no double-sided adhesive tape 14 is aligned with the chips 128.

Figure 4:
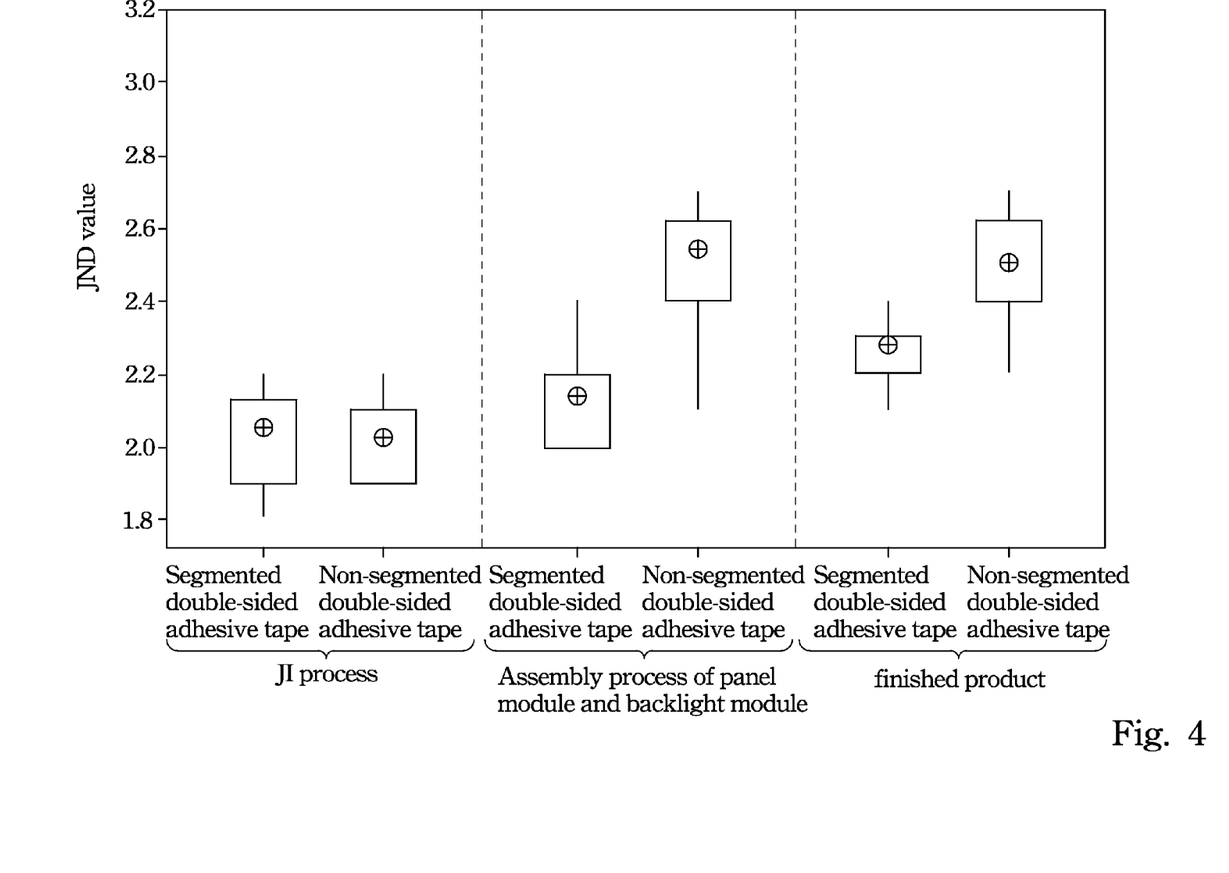
FIG. 4 is a JND value comparison chart showing quantified results of COG mura on a screen of the display apparatus of which a bonding region respectively adopts segmented double-sided adhesive tapes and a non-segmented double-sided adhesive tape during different assembly processes of a panel module and a backlight module.

FIG. 4 is a JND value comparison chart showing quantified results of COG mura on the screen of the display apparatus 1 of which the bonding region 120a respectively adopts segmented double-sided adhesive tapes 14 and a non-segmented double-sided adhesive tape during different assembly processes of the panel module 12 and the backlight module 10.

FIG. 4 is a statistical chart showing mean values of JND values by measuring the COG mura on the screen of the display apparatus 1 respectively in different assembly processes (i.e., the JI process, an assembly process of the panel module 12 and the backlight module 10, and a finished product stage of the display apparatus 1) of the panel module 12 and the backlight module 10, in which the mean values in each of the different assembly processes are generated respectively from 30 JND values of adopting segmented double-sided adhesive tapes 14 on the bonding regions 120a and 30 JND values of adopting the non-segmented double-sided adhesive tape on the bonding regions 120a. In FIG. 4, it can be clearly seen that local stresses are getting worse, thus causing the warpage on the bonding region 120a of the TFT array substrate 120 during the assembly process of the panel module 12 and the backlight module 10, but the JND value of adopting the segmented double-sided adhesive tapes 14 is obviously lower than the JND value of adopting the non-segmented double-sided adhesive tape. Similarly, the JND value of adopting the segmented double-sided adhesive tapes 14 on the bonding region 120a is also obviously lower than the JND value of adopting the non-segmented double-sided adhesive tape on the bonding region 120a during the finished product stage of the display apparatus 1. That is, the display apparatus 1 of the disclosure that adopts the approach of disposing the segmented double-sided adhesive tapes 14 on the supporting surface 116a of the frame 116 of the backlight module 10 effectively suppresses the warping problem on the bonding region 120a of the TFT array substrate 120, eases the light leakages at locations of the bonding region 120a respectively corresponding to the upper-left corner and the upper-right corner of each of the chips 128, and prevents the COG mura from appearing on the screen of the display apparatus 1.

Figure 5:
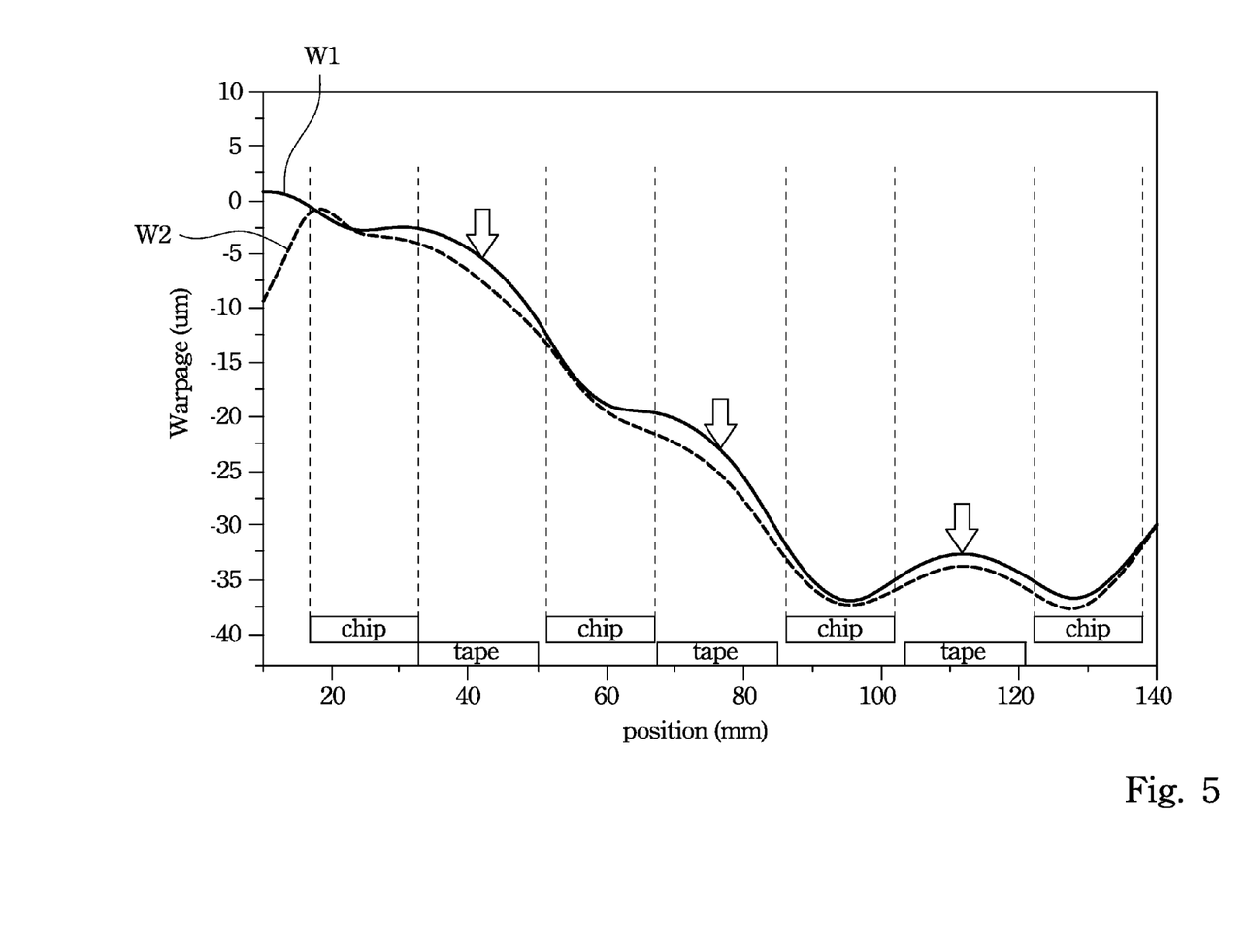
FIG. 5 is a warp diagram of different positions of the bonding region respectively adopts the segmented double-sided adhesive tapes and the non-segmented double-sided adhesive tape.

FIG. 5 is a warp diagram of different positions of the bonding region 120a respectively adopts segmented double-sided adhesive tapes 14 and the non-segmented double-sided adhesive tape.

As shown in FIG. 5, curve W1 (the solid line in FIG. 5) is a warping curve measured from the bonding region 120a that is adhered to the supporting surface 116a of the frame 116 by adopting the non-segmented double-sided adhesive tape, and curve W2 (the dotted line in FIG. 5) is a warping curve measured from the bonding region 120a that is adhered to the supporting surface 116a of the frame 116 by adopting the segmented double-sided adhesive tapes 14. In FIG. 5, it can be clearly seen that the display apparatus 1 of the disclosure that adopts the approach of disposing the segmented double-sided adhesive tapes 14 on the supporting surface 116a of the frame 116 of the backlight module 10 can effectively suppress the warping problem on the bonding region 120a of the TFT array substrate 120, especially to the portions of the bonding region 120a (indicated by arrows in FIG. 5) corresponding to the gaps G among the chips 128.

Furthermore, the aforementioned light leakages relates to the different lengths of the segmented double-sided adhesive tapes 14, and thus the disclosure appropriately reduces the lengths of the segmented double-sided adhesive tapes 14 to effectively prevent the screen of the display apparatus 1 from having COG mura and to achieve the purpose of reducing the JND values. Embodiments of the disclosure are introduced in detail below.

Figure 6A:
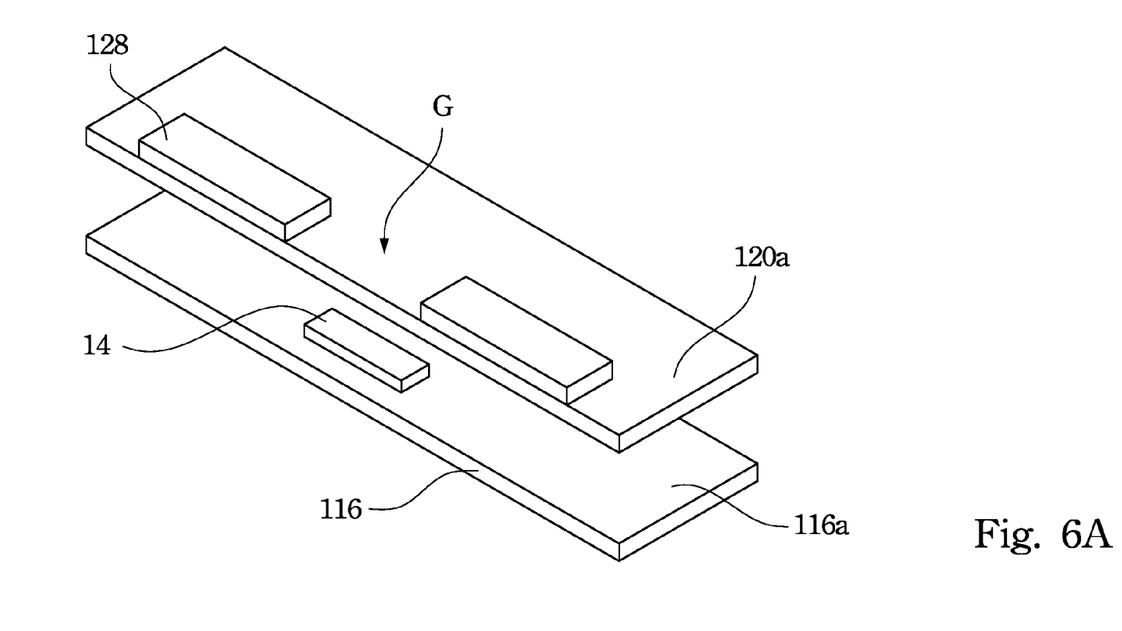
FIG. 6A is a partially perspective view of a frame and the bonding region according to an embodiment of the disclosure.
Figure 6B:
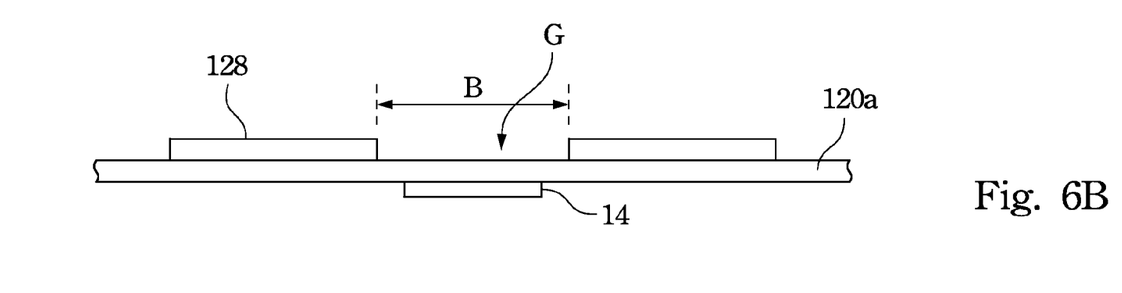
FIG. 6B is a side view of the frame and the bonding region in FIG. 6A.

FIG. 6A is a partially perspective view of the frame 116 and the bonding region 120a according to an embodiment of the disclosure. FIG. 6B is a side view of the frame 116 and the bonding region 120a in FIG. 6A.

As shown in FIG. 3, FIG. 6A, and FIG. 6B, the vertical projection of each of the double-sided adhesive tapes 14 of the display apparatus 1 is not overlapped with the vertical projections of two adjacent chips 128 on the supporting surface 116a. In the embodiment, the chips 128 of the panel module 12 are arranged along an arrangement direction D. The width of the gap G between the adjacent chips 128 along the arrangement direction D is denoted by B. In order to appropriately reduce the lengths of the segmented double-sided adhesive tapes 14 to effectively prevent the screen of the display apparatus 1 from having COG mura and to achieve the purpose of reducing the JND values, the following experiments are made.

Figure 7:
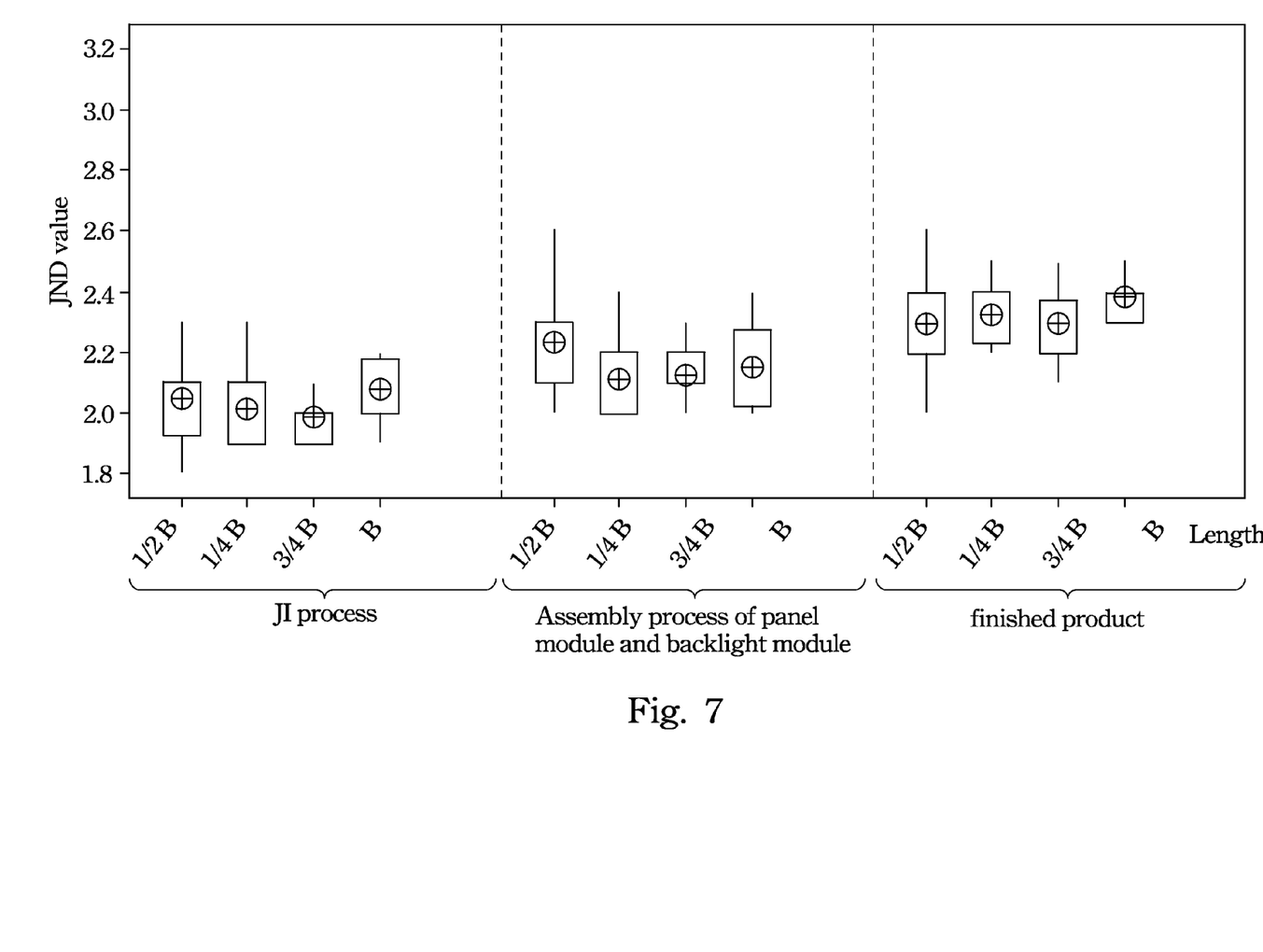
FIG. 7 is a JND value comparison chart showing quantified results of COG mura on the screen of the display apparatus of which the bonding region respectively adopts the double-sided adhesive tapes with different lengths of to which each vertical projection is not overlapped with vertical projections of two adjacent chips on the supporting surface during different assembly processes of the panel module and the backlight module.

FIG. 7 is a JND value comparison chart showing quantified results of COG mura on the screen of the display apparatus 1 of which the bonding region 120a respectively adopts the double-sided adhesive tapes 14 with different lengths of which each vertical projection is not overlapped with the vertical projections of two adjacent chips 128 on the supporting surface 116a during different assembly processes of the panel module 12 and the backlight module 10.

FIG. 7 is a statistical chart showing mean values of JND values by measuring the COG mura on the screen of the display apparatus 1 respectively in different assembly processes (i.e., the JI process, assembly process of the panel module 12 and the backlight module 10, and finished product stage of the display apparatus 1) of the panel module 12 and the backlight module 10, in which the mean values in each of the different assembly processes are generated from 20 JND values of adopting segmented double-sided adhesive tapes 14 with different lengths (i.e., the lengths of the segmented double-sided adhesive tapes 14 along the arrangement direction D are respectively reduced to be ¼, ½, ¾, and 1 times of the width B of the corresponding gap G along the arrangement direction D) of which each vertical projection is not overlapped with the vertical projections of two adjacent chips 128 on the supporting surface 116a. Comparing FIG. 4 with the FIG. 7, it can be clearly seen that the aggravated local stresses cause the flexure occurred on the bonding region 120a of the TFT array substrate 120 during the assembly process of the panel module 12 and the backlight module 10. The mean values of the JND values measured by adopting the segmented double-sided adhesive tapes 14 with different lengths are substantially lower than 2.3 (as shown in FIG. 7), whereas the mean values of the JND values measured by adopting the non-segmented double-sided adhesive tape are substantially higher than 2.3 (as shown in FIG. 4). Similarly, during the finished product stage of the display apparatus 1, the mean values of the JND values measured by adopting the segmented double-sided adhesive tapes 14 with different lengths are substantially lower than 2.4 (as shown in FIG. 7), whereas mean values of the JND values measured by adopting the non-segmented double-sided adhesive tape are substantially higher than 2.4 (as shown in FIG. 4).

It can be seen that, compared with the display apparatus adopting the non-segmented double-sided adhesive tape, the display apparatus 1 adopting the segmented double-sided adhesive tapes 14 of which the lengths along the arrangement direction D are reduced to be ¼ to 1 times of the width B of the corresponding gap G along the arrangement direction D does effectively reduce the JND values. Preferably, the lengths of the segmented double-sided adhesive tapes 14 along the arrangement direction D can be reduced to be ½ to ¾ times of the width B of the corresponding gap G along the arrangement direction D. The data of the aforementioned experiments are shown as Chart 1, in which increment values of the JND values can be obtained by subtracting the mean values of the JND values during each of the processes with the mean values of the JND values during the JI process. It can be seen that, compared with the display apparatus adopting the non-segmented double-sided adhesive tape, the display apparatus 1 adopting the segmented double-sided adhesive tapes 14 of which the lengths along the arrangement direction D are reduced to be ¼ to 1 times of the width B of the corresponding gap G along the arrangement direction D can obtain lower increment values. Therefore, by appropriately reducing the lengths of the segmented double-sided adhesive tapes 14 within the aforementioned range, the disclosure can effectively suppress the warping problem on the bonding region 120a of the TFT array substrate 120, and ease the light leakages at locations of the bonding region 120a respectively corresponding to the upper-left corner and the upper-right corner of each of the chips 128, and prevent the COG mura on the screen of the display apparatus 1.

Chart 1 shows mean values and increment values of JND values respectively measured from the bonding region adopting the segmented double-sided adhesive tapes with different lengths of which each vertical projection respectively is not overlapped with the vertical projections of two adjacent chips on the supporting surface

| Length of segmented double-sided adhesive tape | JND value | JI process | Assembly process of panel module and backlight module | Finished product |
|---|---|---|---|---|
| B | Mean value | 2.075 | 2.115 | 2.38 |
|   | Increment value | N/A | 0.08 | 0.305 |
| ¾ B | Mean value | 1.98 | 2.125 | 2.28 |
|   | Increment value | N/A | 0.105 | 0.3 |
| ½ B | Mean value | 2.045 | 2.23 | 2.3 |
|   | Increment value | N/A | 0.185 | 0.255 |
| ¼ B | Mean value | 2.011 | 2.11 | 2.32 |
|   | Increment value | N/A | 0.095 | 0.305 |
| Non-segmented double-sided adhesive tape | Mean value | 2.205 | 2.52 | 2.61 |
|   | Increment value | N/A | 0.315 | 0.405 |

Figure 8A:
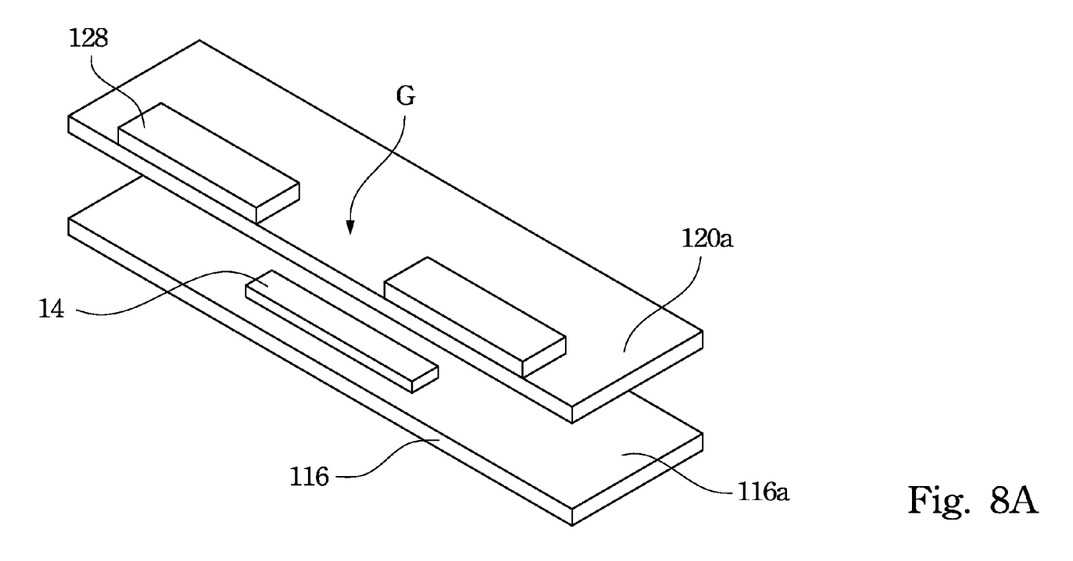
FIG. 8A is a partially perspective view of the frame and the bonding region according to an embodiment of the disclosure.
Figure 8B:
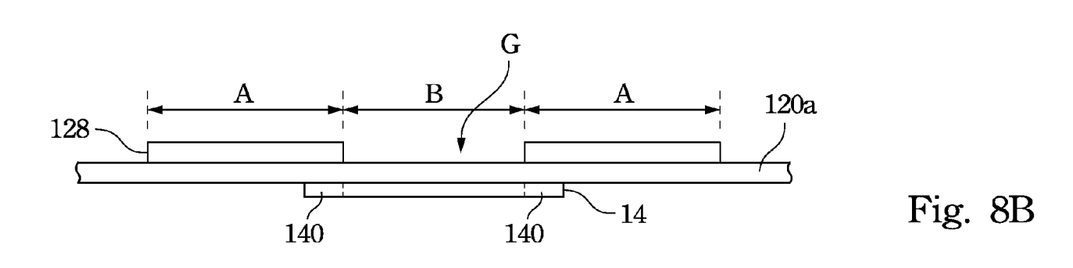
FIG. 8B is a side view of the frame and the bonding region in FIG. 8A.

FIG. 8A is a partially perspective view of the frame 116 and the bonding region 120a according to an embodiment of the disclosure. FIG. 8B is a side view of the frame 116 and the bonding region 120a in FIG. 8A.

As shown in FIG. 3, FIG. 8A, and FIG. 8B, the vertical projection of each of the double-sided adhesive tapes 14 of the display apparatus 1 is partially overlapped with the vertical projections of two adjacent chips 128 on the supporting surface 116a. In the embodiment, the chips 128 of the panel module 12 are arranged along the arrangement direction D. Each of the double-sided adhesive tapes 14 of the display apparatus 1 has two overlapped portions 140 respectively corresponding to two adjacent chips 128. The length of each chip is denoted by A. The width of the gap G between the adjacent chips 128 along the arrangement direction D is denoted by B. In order to appropriately reduce the lengths of the segmented double-sided adhesive tapes 14 to effectively prevent the screen of the display apparatus 1 from having COG mura and to achieve the purpose of reducing the JND values, the following experiments are made.

Figure 9:
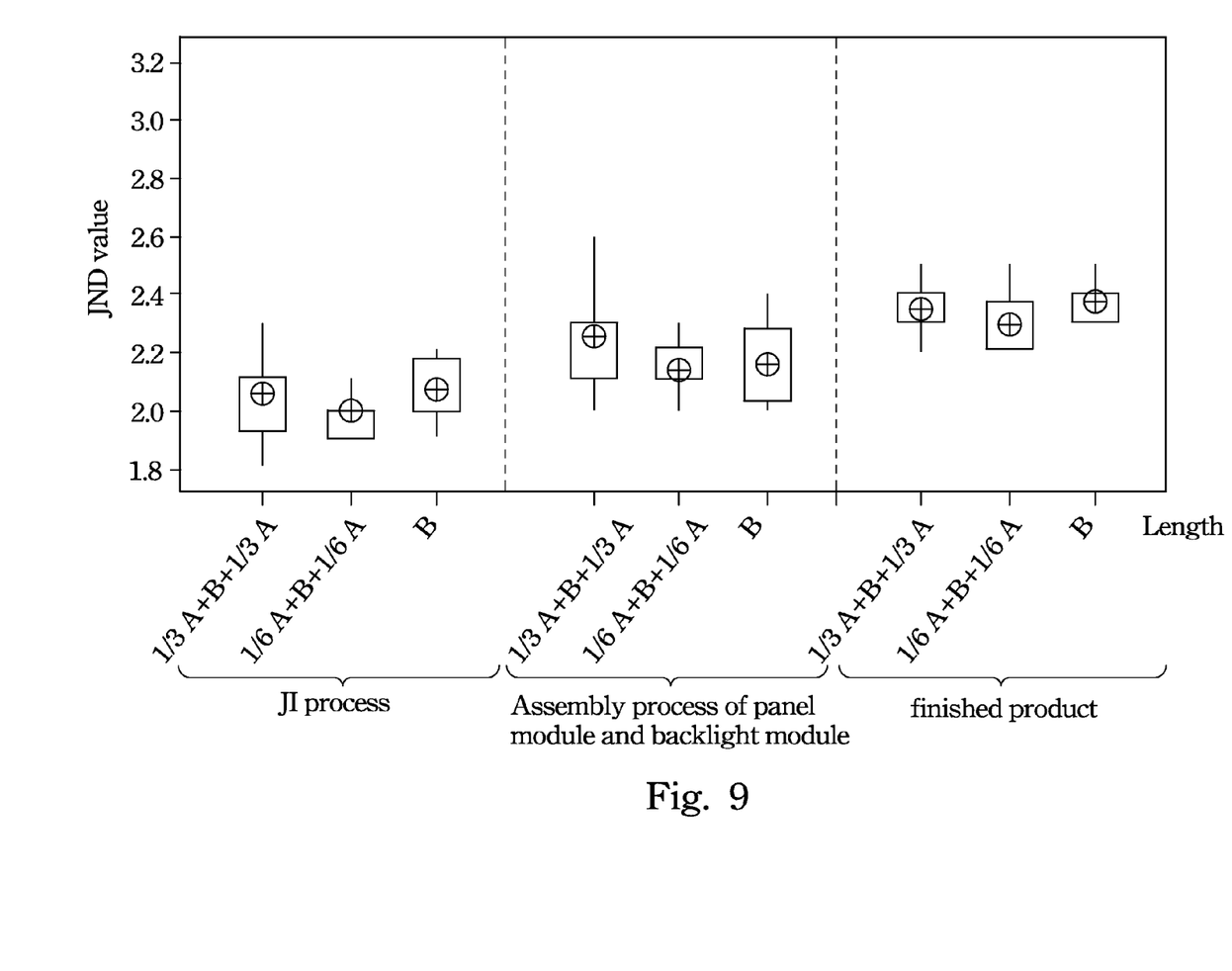
FIG. 9 is a JND value comparison chart showing quantified results of COG mura on the screen of the display apparatus of which the bonding region respectively adopts the double-sided adhesive tapes with different lengths of which each vertical projection is partially overlapped with the vertical projections of two adjacent chips on the supporting surface during different assembly processes of the panel module and the backlight module.

FIG. 9 is a JND value comparison chart showing quantified results of COG mura on the screen of the display apparatus 1 of which the bonding region 120a respectively adopts the double-sided adhesive tapes 14 with different lengths of which each vertical projection is partially overlapped with the vertical projections of two adjacent chips 128 on the supporting surface 116a during different assembly processes of the panel module 12 and the backlight module 10.

FIG. 9 is a statistical chart showing mean values of JND values by measuring the COG mura on the screen of the display apparatus 1 respectively in different assembly processes (i.e., the JI process, assembly process of the panel module 12 and the backlight module 10, and finished product stage of the display apparatus 1) of the panel module 12 and the backlight module 10, in which the mean values in each of the different assembly processes are generated from 20 JND values of adopting segmented double-sided adhesive tapes 14 with different lengths (i.e., the length of each of the overlapped portions 140 of the segmented double-sided adhesive tapes 14 along the arrangement direction D are respectively reduced to be 1/3, 1/6, and 1 times the length A of the corresponding chip 128 along the arrangement direction D) of which each vertical projection respectively partially overlaps the vertical projections of two adjacent chips 128 on the supporting surface 116a. Comparing FIG. 4 with the FIG. 9, it can be clearly seen that the aggravated local stresses caused the flexure occurred on the bonding region 120a of the TFT array substrate 120 during the assembly process of the panel module 12 and the backlight module 10. The mean values of the JND values measured by adopting the segmented double-sided adhesive tapes 14 with different lengths substantially lower than 2.3 (as shown in FIG. 9), whereas mean values of the JND values measured by adopting the non-segmented double-sided adhesive tape substantially higher than 2.3 (as shown in FIG. 4). Similarly, during the finished product stage of the display apparatus 1, the mean values of the JND values measured by adopting the segmented double-sided adhesive tapes 14 with different lengths substantially lower than 2.4 (as shown in FIG. 9), whereas mean values of the JND values measured by adopting the non-segmented double-sided adhesive tape substantially higher than 2.4 (as shown in FIG. 4).

It can be seen that compared with the display apparatus adopting the non-segmented double-sided adhesive tape, the display apparatus 1 adopting the segmented double-sided adhesive tapes 14 of which the length of each of the overlapped portions along the arrangement direction D are reduced to be 1/3 to 1/6 times of the length A of the corresponding chip 128 along the arrangement direction D does effectively reduce the JND values. The data of the aforementioned experiments are shown as Chart 2, in which increment values of the JND values can be obtained by subtracting the mean values of the JND values during each of the processes from the mean values of the JND values during the JI process. It can be seen that, compared with the display apparatus adopting the non-segmented double-sided adhesive tape, the display apparatus 1 adopting the segmented double-sided adhesive tapes 14 of which the length of each of the overlapping portions 140 along the arrangement direction D are reduced to be 1/3 to 1/6 times of the length A of the corresponding chip 128 along the arrangement direction D can obtain lower increment values. Therefore, by appropriately reducing the lengths of the segmented double-sided adhesive tapes 14 within the aforementioned range, the disclosure can effectively suppress the warping problem on the bonding region 120a of the TFT array substrate 120, and ease the light leakages at locations of the bonding region 120a respectively corresponding to the upper-left corner and the upper-right corner of each of the chips 128, and prevents the COG mura from appearing on the screen of the display apparatus 1.

Chart 2 shows mean values and increment values of JND values respectively measured from bonding region adopting segmented double-sided adhesive tapes with different lengths of which each vertical projection is partially overlapped with the vertical projections of two adjacent chips on the supporting surface

| Length of segmented double-sided adhesive tape | JND value | JI process | Assembly process of panel module and backlight module | Finished product |
|---|---|---|---|---|
| 1/3 A + B + 1/3 A | Mean value | 2.04 | 2.24 | 2.345 |
|  | Increment value | N/A | 0.2 | 0.305 |
| 1/6 A + B + 1/6 A | Mean value | 1.98 | 2.125 | 2.29 |
|  | Increment value | N/A | 0.105 | 0.31 |
| B | Mean value | 2.075 | 2.115 | 2.38 |
|  | Increment value | N/A | 0.08 | 0.305 |
| Non-segmented double-sided adhesive tape | Mean value | 2.205 | 2.52 | 2.61 |
|  | Increment value | N/A | 0.315 | 0.405 |

According to the aforementioned embodiments of the disclosure, it can be seen that in the display apparatus of the disclosure, segmented double-sided adhesive tapes are stuck on a supporting surface of a frame of a backlight module. Furthermore, when a TFT array substrate of a panel module of the display apparatus is mounted to the frame, each of the double-sided adhesive tapes is located at a gap between two adjacent chips on the TFT array substrate, so as to effectively eliminate the light leakages occurring at locations respectively corresponding to the upper-left corner and the upper-right corner of each of the chips, and to prevent the screen of the display apparatus from having COG mura as much as possible.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A display apparatus, comprising:
a backlight module comprising a frame having a supporting surface;
a panel module comprising:
   a glass substrate disposed on the supporting surface, an edge of the glass substrate having a bonding region; and
   a plurality of chips disposed at the bonding region, wherein the chips and the supporting surface are respectively located at two opposite sides of the glass substrate; and
at least one double-sided adhesive tape disposed between the supporting surface and the bonding region, a vertical projection on the supporting surface of the double-sided adhesive tape being located at a corresponding gap between two adjacent chips.
2. The display apparatus of claim 1, wherein the vertical projection on the supporting surface of the double-sided adhesive tape is not overlapped with vertical projections on the supporting surface of two adjacent chips.
3. The display apparatus of claim 2, wherein the chips are arranged along an arrangement direction, and a length of the double-sided adhesive tape along the arrangement direction is 1/4 to 1 times of a width of the corresponding gap along the arrangement direction.

4. The display apparatus of claim 3, wherein the length of the double-sided adhesive tape along the arrangement direction is ½ to ¾ times the width of the corresponding gap along the arrangement direction.

5. The display apparatus of claim 1, wherein the vertical projection on the supporting surface of the double-sided adhesive tape is partially overlapped with vertical projections on the supporting surface of two adjacent chips.

6. The display apparatus of claim 5, wherein the chips are arranged along an arrangement direction, and the double-sided adhesive tape has two overlapped portions respectively corresponding to two adjacent chips, and a length of each of the overlapped portions along the arrangement direction is ⅓ to ⅙ times of a length of the corresponding chip along the arrangement direction.

7. The display apparatus of claim 6, wherein the length of each of the overlapped portions along the arrangement direction is ⅙ times of the length of the corresponding chip along the arrangement direction.

8. The display apparatus of claim 1, wherein the glass substrate is a TFT array substrate.

\* \* \* \* \*